United States Patent
Wang et al.

(10) Patent No.: US 6,397,377 B1
(45) Date of Patent: May 28, 2002

(54) METHOD OF PERFORMING OPTICAL PROXIMITY CORRECTIONS OF A PHOTO MASK PATTERN BY USING A COMPUTER

(75) Inventors: Bing-Ying Wang, Hsin-Chu; Chun-Yi Yang, Hsin-Chu Hsien; Chun-Jung Lin, Hsin-Chu; Jui-Chin Chang, Tai-Chung Hsien; Mam-Tsung Wang, Hsin-Chu, all of (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/414,899

(22) Filed: Oct. 8, 1999

(51) Int. Cl.[7] .................................................. G06F 17/50

(52) U.S. Cl. ........................................................ 716/21

(58) Field of Search ............................. 716/2, 21, 19, 716/20

(56) References Cited

U.S. PATENT DOCUMENTS 5,553,274 A * 9/1996 Liebmann .................... 716/21

* cited by examiner

Primary Examiner—Matthew Smith
Assistant Examiner—Thuan Do
(74) Attorney, Agent, or Firm—Winston Hsu

(57) ABSTRACT

The present invention provides a method of performing optical proximity corrections of a photo mask pattern by using a computer. The photo mask pattern is formed on a photo mask which is used when performing photolithography for forming a predetermined original pattern by exposing a photo-resist layer in a predetermined area of a semiconductor wafer. The photo mask pattern is divided into a plurality of rectangular blocks. Each block can be bright or dark, and a least one side and two corners of the block are shared with another block. Each of shared corners is checked to find corners which may be affected by an optic proximity effect, and those corners are modified so as to prevent them from being affected by the optic proximity effect.

10 Claims, 6 Drawing Sheets

0 0 1 1 1
0 0 1 0 0
1 1 1 0 0
0 1 0 1 0
0 1 0 0 0
0 1 1 0 0

METHOD OF PERFORMING OPTICAL PROXIMITY CORRECTIONS OF A PHOTO MASK PATTERN BY USING A COMPUTER

BACKGROUND OF THE INVENTION

1. Field of the invention

The present invention relates to a method of performing optical proximity corrections (OPC) of a photo mask pattern, and more particularly, to a method of performing OPC to rapidly correct a photo mask pattern by using computer to eliminate an optic proximity effect.

2. Description of the Prior Art

In the semiconductor process, in order to transfer an integrated circuit pattern onto a semiconductor wafer, a photo mask pattern is designed first. Then a photo mask is formed according to the photo mask pattern by performing a photolithographic process. The pattern on the photo mask is then transferred in proportion onto a photo-resist layer on a semiconductor wafer.

The critical dimension of the pattern on the photo mask is limited by the resolution limit of the optical exposure tool. As the design pattern of integrated circuits becomes smaller and the photo mask pattern becomes of higher density in its pattern arrangement, the optical proximity effect will easily occur during the photolithographic process for forming the photo mask according to the photo mast pattern. The optical proximity effect will cause overexposure or underexposure at corners in the photo mask pattern, resulting in a resolution loss which causes formations of round profiles at those corners or so-called corner rounding effect. Moreover, when the pattern is transferred onto the photo-resist layer during the photolithographic process, same effects occur, resulting in variations in the patterns on the photo mask and on the photo-resist layer. Therefore, the pattern on the photo-resist layer is far different from the original photo mask pattern.

The prior art method to solve the above problem is to perform optical proximity corrections (OPC) of a photo mask pattern by using a computer aided design (CAD), so that a corrected pattern is formed on the photo mask to eliminate the optical proximity effect.

Please refer to FIG. 1 to FIG. 4. FIG. 1 to FIG. 4 are schematic diagrams of a prior art method for performing optical proximity corrections of a photo mask pattern by using a computer. In the prior art method, the OPC is performed on a photo mask pattern 10 by using a computer (not shown). The memory of the computer can be used for storing the photo mask pattern 10 and programs, and the processor of the computer can be used for executing the programs stored in the memory.

As shown in FIG. 1, the photo mask pattern 10 comprises a plurality of sides and corners, and each corner formed by joining two adjacent sides. The prior art method for performing OPC of the photo mask pattern 10 is to find the places which may be affected by an optic proximity effect according to a predetermined design rules checker. In addition, as the photo mask pattern 10 is affected by the optic proximity effect, it becomes round in shape. In the prior art method, this condition is simulated to form a simulation pattern 12 of a round shape as shown in FIG. 2. Finally, dark corners 14 outside the simulation pattern 12 are found by comparing the photo mask pattern 10 and the simulation pattern 12, as shown in FIG. 3. The dark corners 14 are the regions where resolution loss may possibly occur. In FIG. 3, the regions labelled by oblique lines illustrate the dark corners 14.

After finding the regions where resolution lossmay possiblly occur, a protruded portion 16 of a rectangular shape is formed at each dark corner 14 as a serif to prevent the dark corner 14 from being affected by the corner rounding effect. As shown in FIG. 4, the protruded portions 16 and the photo mask pattern 10 are combined to form a photo mask pattern 18 with OPC in which the optical proximity effect is eliminated. However, the prior art method for performing OPC of the whole photo mask pattern 10 takes more than 24 hours to perform the method. It is a large waste in the process cost.

SUMMARY OF THE INVENTION

It is therefore a primary objective of the present invention to provide a method of performing optical proximity corrections (OPC) of a photo mask pattern by using a computer to solve the above mentioned problem.

In a preferred embodiment, the present invention provides a method of performing optical proximity corrections of a photo mask pattern by using a computer. The computer comprises a memory for storing the photo mask pattern and programs, and a processor for executing the programs stored in the memory. The photo mask pattern is formed on a photo mask which is used when performing a photolithographic process for forming a predetermined original pattern by exposing a photo-resist layer in a predetermined area of a semiconductor wafer. The method comprises:

- dividing the photo mask pattern into a plurality of rectangular blocks, each of the rectangular blocks comprising four sides and four corners each formed by joining two adjacent sides wherein each rectangular block can be a bright rectangular block or a dark rectangular block, at least one side and two corners of the rectangular block are shared with another rectangular block;
- checking each of shared corners of the photo mask pattern to find corners which may be affected by an optic proximity effect; and
- modifying the corners which may be affected so as to prevent them from being affected by the optic proximity effect.

It is an advantage of the present invention that the method of performing OPC of a photo mask pattern by using computer can rapidly and effectively correct the photo mask pattern to eliminate the optic proximity effect.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
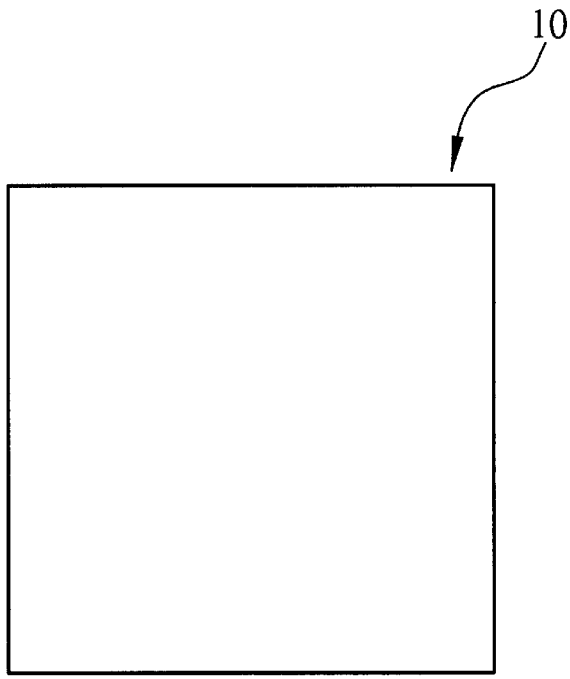
FIG. 1 to FIG. 4 are schematic diagrams of a prior art method for performing optical proximity corrections of a photo mask pattern by using a computer.
Figure 2:
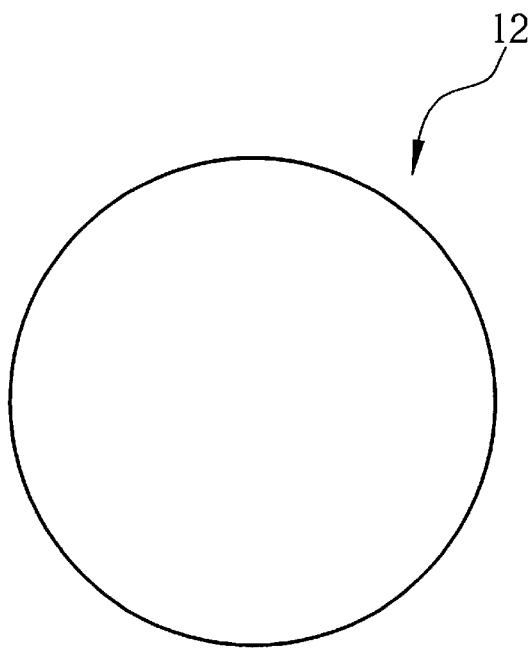
Figure 3:
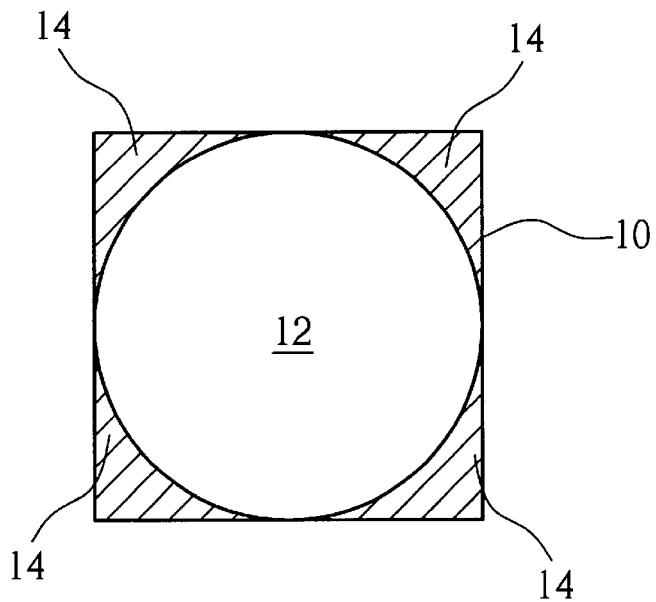
Figure 4:
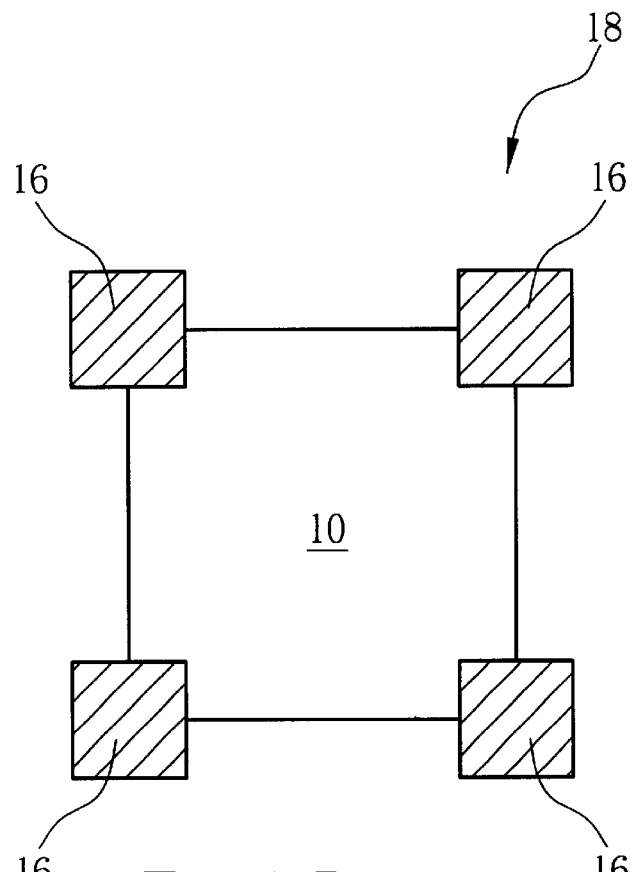
Figures 5, 6:
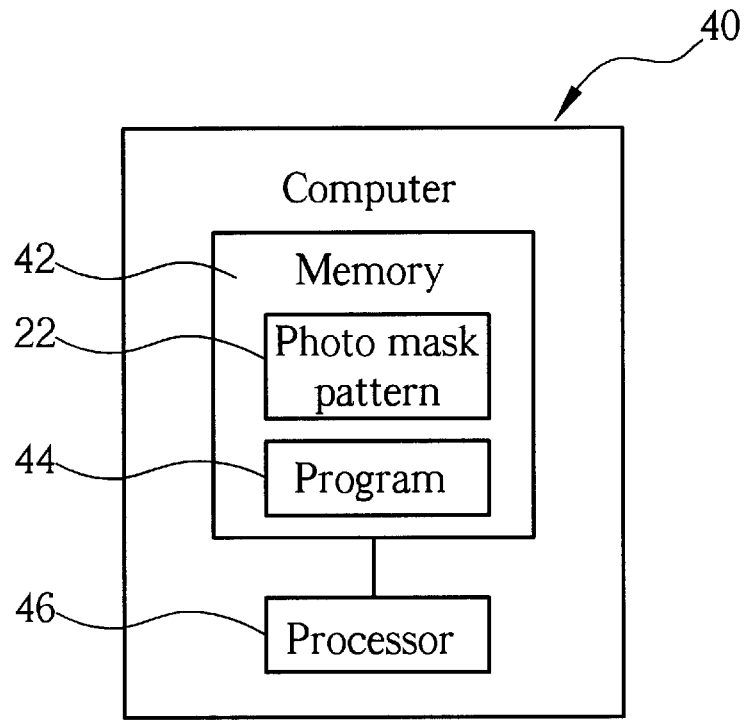
FIG. 5 is a block diagram of a computer used in the method for performing OPC of a photo mask pattern according to the present invention.
FIG. 6 is a schematic diagram of a code for an embodiment of the invention method.
Figure 7:
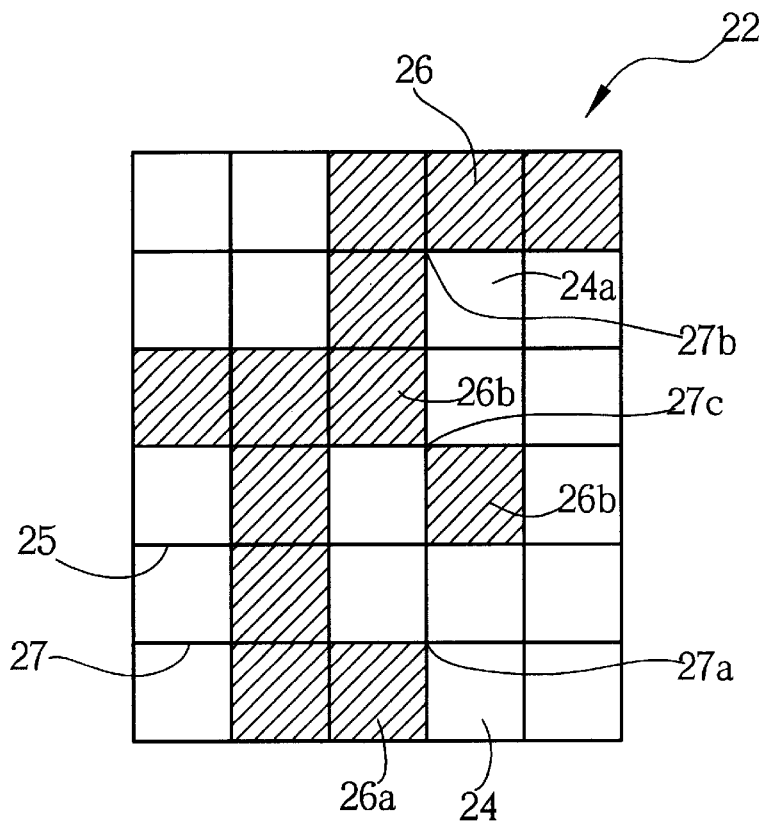
FIG. 7 is a schematic diagram of a photo mask pattern formed according to the code shown in FIG. 6.

Please refer to FIG. 5 to FIG. 7. FIG. 5 is a block diagram of a computer 40 used in the method for performing OPC of a photo mask pattern according to the present invention. FIG. 6 is a schematic diagram of a code 20 for an embodiment of the invention method. FIG. 7 is a schematic diagram of a photo mask pattern 22 formed according to the code 20 shown in FIG. 6. The present invention is a method of performing OPC of a photo mask pattern 22 by using a computer 40. The computer 40 comprises a memory 42 for storing the photo mask pattern 22 and programs 44, and a processor 46 for executing the programs 44 stored in the memory 42.

The photo mask pattern 22 is formed on a photo mask which is used when performing a photolithographic process for forming a predetermined original pattern by exposing a photo-resist layer in a predetermined area of a semiconductor wafer (not shown). The semiconductor wafer is used for forming a read only memory (ROM), and the photo mask pattern 22 is used for forming a code mask of the ROM. In the photolithographic process, the pattern of the code mask is transferred onto the photo-resist layer in the predetermined area of the semiconductor wafer for forming the ROM.

As shown in FIG. 6 and FIG. 7. The photo mask pattern 22 is of a square shape formed according to the code 20 and divided into a plurality of rectangular blocks. Each of the rectangular blocks is either a bright or a dark rectangular block wherein a rectangular block 24 is set to correspond to the code 0, and a dark rectangular block 26 is set to correspond to the code 1. Each rectangular block is of a square shape, which comprises four sides 25 and four corners 27 each formed by joining two adjacent sides 25. At least one side 25 and two corners 27 of the rectangular block are shared with another rectangular block. A smallest line width and a smallest line space of the photo mask pattern is a multiple of a width of the rectangular block.

Please refer to FIG. 8 to FIG. 11. FIG. 8 to FIG. 11 are schematic diagrams of the present invention method of performing OPC of the photo mask pattern 22. The present invention is a method of performing OPC of the photo mask pattern 22 by using the computer 40. In the invention method, the corners 27 shared with four rectangular blocks of the photo mask pattern 22 are checked according to three predetermined conditions as a logic operation to find out those corners which may be affected by the optic proximity effect. Then, the OPC is performed at those corners satisfied with the conditions.

The first condition: check each of the corners of the photo mask pattern 22 shared with four rectangular blocks. If a corner is shared by one dark rectangular block 26 and three bright rectangular blocks, the corner is satisfied with the first condition. The corner will be corrected by forming a protruded portion 28.

Figure 8:
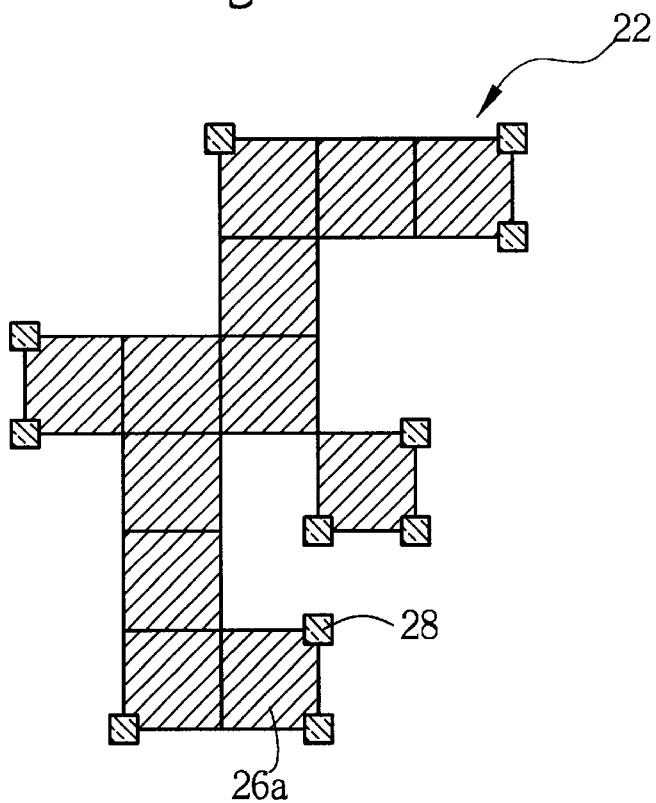
FIG. 8 to FIG. 11 are schematic diagrams of the present invention method of performing OPC of the photo mask pattern.

As shown in FIG. 7 and FIG. 8. The corner 27a is shared by one dark rectangular block 26a which will cause the corner 27a to become a protruded dark corner. Therefore, when the OPC is performed, the corner 27a is corrected by forming a protruded dark portion 28 to eliminate the optical proximity effect affecting the corner.

The second condition: check each of the corners of the photo mask pattern 22 shared by four rectangular blocks. If a corner is shared by one bright rectangular block 24a and three dark rectangular blocks, the corner is satisfied with the second condition. The corner will be corrected by forming a protruded dark portion 30.

Figure 9:
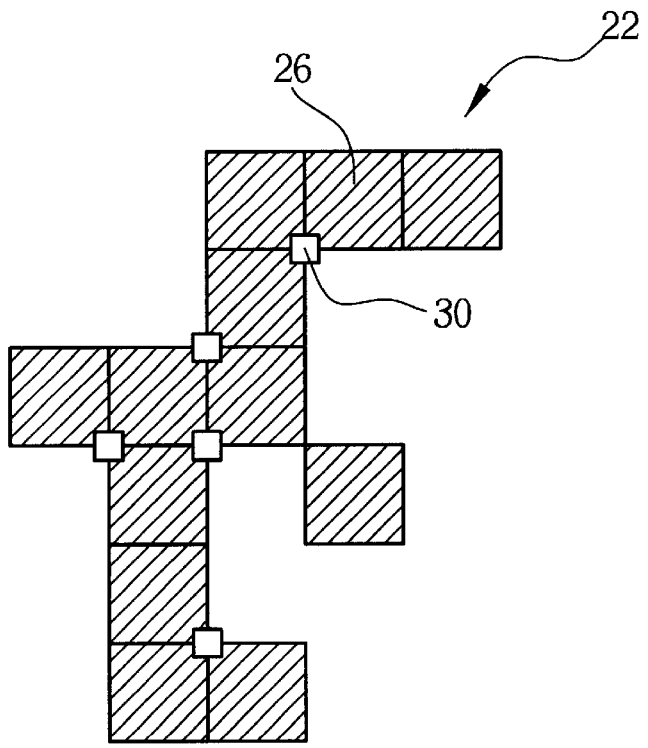

As shown in FIG. 7 and FIG. 9. The corner 27b is shared by one bright rectangular block 24a which will cause the corner 27b to become a protruded bright corner. When the OPC is performed, the corner 27b is corrected by forming a protruded bright portion 30 to eliminate the optical proximity effect affecting the corner.

The third condition: check each of the corners of the photo mask pattern 22 shared by four rectangular blocks. If a corner is shared by two bright rectangular blocks 24 and two dark rectangular blocks 26 with the two dark rectangular blocks 26 being arranged diagonally, the corner is satisfied with the third condition. The corner will be corrected by forming a protruded dark portion 32.

Figure 10:
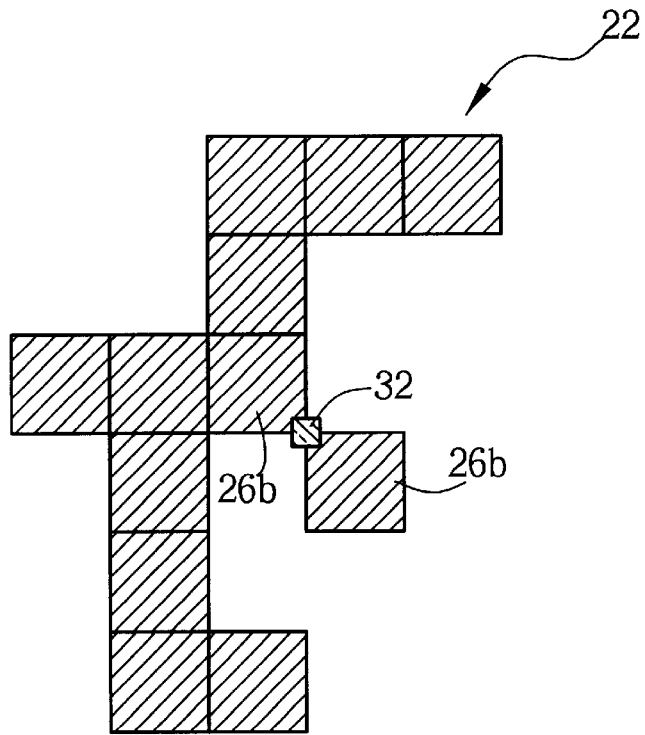

As shown in FIG. 7 and FIG. 10. The corner 27c is shared by two dark rectangular blocks 26 arranged diagonally. When performing OPC, the corner 27c is corrected by forming a protruded dark portion 32 to eliminate the optical proximity effect affecting the corner.

Figure 11:
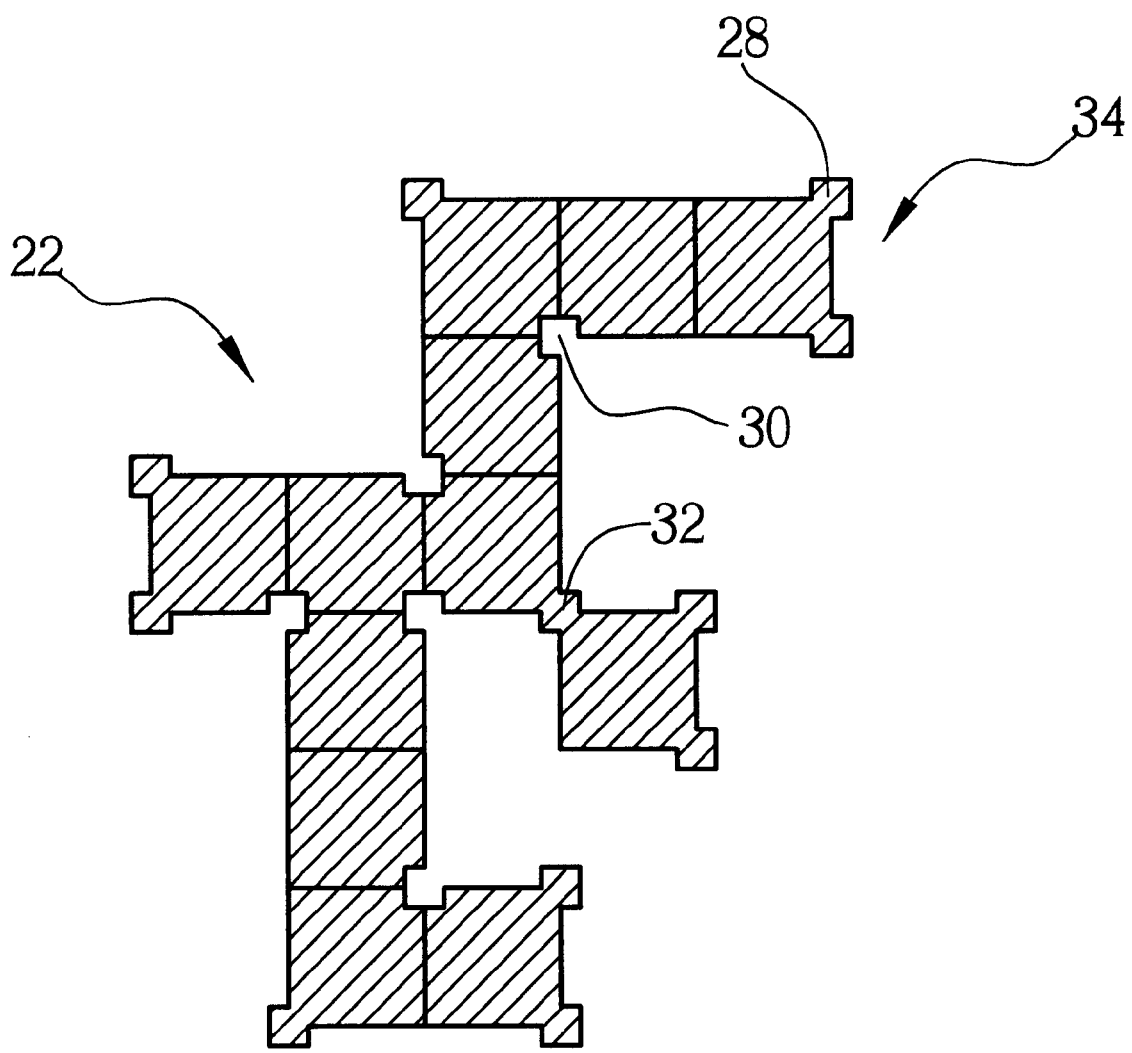

As shown in FIG. 11. According to the three conditions described above, each corner can be checked by using the computer 40 to find out those corners which may be affected by the optical proximity effect. And then those corners are modified by forming the protruded dark portion 28, the protruded bright portion 30 or the protruded dark portion 32 according to the three conditions. The original photo mask pattern 22 and the protruded portions 28, 30, 32 are combined to form a photo mask pattern 34 with the OPC.

The invention method can effectively and rapidly find out the corners which may be affected by the optical proximity effect by a simple logic operation, and modify the corners which may be affected by the optical proximity effect by forming the protruded portions 28, 30 or 32 according to the three conditions. Only about 10 minutes are needed to complete the whole modification. Therefore, the present invention can rapidly perform OPC of the photo mask pattern 22 to eliminate the optical proximity effect.

In contrast to the prior art method, the method of performing OPC of the photo mask pattern 22 according to the present invention checks each corner shared by four rectangular blocks of the photo mask pattern 22 by a simple logic operation, and perform the OPC by forming the protruded portion 28, 30, 32 in the corners satisfied with the three conditions. Thus, the method of performing OPC of the photo mask pattern 22 can effectively and rapidly eliminate the optical proximity effect.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of performing optical proximity corrections of a photo mask pattern by using a computer, the computer comprising a memory for storing the photo mask pattern and programs, and a processor for executing the programs stored in the memory, the photo mask pattern being formed on a photo mask which is used when performing a photolithographic process for forming a predetermined original pattern by exposing a photo-resist layer in a predetermined area of a semiconductor wafer, the method comprising;

dividing the photo mask pattern into a plurality of rectangular blocks, each of the rectangular blocks comprising four sides and four corners each formed by joining two adjacent sides wherein each rectangular block can be a bright rectangular block or a dark rectangular block, at least one side and two corners of the rectangular block are shared with another rectangular block;

checking each of shared corners of the photo mask pattern to find corners which may be affected by an optic proximity effect; and modifying the corners, which may be affected so as to prevent them from being affected by the optic proximity effect by forming a protruded dark portion or a protruded bright portion at the corners for correcting the corners.

2. The method of claim 1 wherein the photo mask pattern is of a square shape, each of the rectangular blocks comprises at least two sides shared with another two rectangular blocks.

3. The method of claim 2 wherein each of the corners to be checked is shared with four rectangular blocks of the photo mask pattern, when finding a corner which may be affected by the optic proximity effect, a protruded portion will be formed at the corner for correcting the corner so as to prevent the corner from being affected by the optic proximity effect.

4. The method of claim 3 wherein if a corner is shared by one dark rectangular block and three bright rectangular blocks, the corner will be corrected by forming a protruded dark portion.

5. The method of claim 3 wherein if a corner is shared by one bright rectangular block and three dark rectangular blocks, the corner will be corrected by forming a protruded bright portion.

6. The method of claim 3 wherein if a corner is shared by two dark rectangular blocks and two bright rectangular blocks with the two dark rectangular blocks arranged diagonally, the corner will be corrected by forming a protruded dark portion.

7. The method of claim 3 wherein the protruded portion is a serif.

8. The method of claim 1 wherein the semiconductor wafer is used for forming a read only memory (ROM), and the photo mask pattern is used for forming a code mask of the ROM.

9. The method of claim 1 wherein each rectangular block is of a square shape, and a smallest line width of the photo mask pattern is a multiple of a width of the rectangular block.

10. The method of claim 1 wherein each rectangular block is of a square shape, and a smallest line space of the photo mask pattern is a multiple of a width of the rectangular block.

* * * * *